(12) United States Patent
Sumiyoshi

(10) Patent No.: US 11,835,863 B2
(45) Date of Patent: Dec. 5, 2023

(54) EXPOSURE APPARATUS, EXPOSURE METHOD, AND MANUFACTURING METHOD FOR PRODUCT

(71) Applicant: CANON KABUSHIKI KAISHA, Tokyo (JP)

(72) Inventor: Yuhei Sumiyoshi, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/847,037

(22) Filed: Jun. 22, 2022

(65) Prior Publication Data
US 2022/0413392 A1 Dec. 29, 2022

(30) Foreign Application Priority Data
Jun. 23, 2021 (JP) ................... 2021-104157

(51) Int. Cl.
*G03F 7/00* (2006.01)
(52) U.S. Cl.
CPC .......... *G03F 7/706* (2013.01); *G03F 7/70775* (2013.01)
(58) Field of Classification Search
CPC .. G03F 7/706; G03F 7/70775; G03F 7/70108; G03F 7/7025; G03F 7/70258; G03F 7/70333; G03F 7/70575; G03F 7/70091; G03F 7/70008; G03F 7/7015; G03F 7/70158; G03F 7/70358; G03F 7/70308; G03F 7/70466; H01L 21/26513; H01L 21/764; H01L 27/1463; G01M 11/0221; G01M 11/0264; G02B 7/003
See application file for complete search history.

(56) References Cited

U.S. PATENT DOCUMENTS

| | | | |
|---|---|---|---|
| 4,798,962 A | 1/1989 | Matsumoto | |
| 6,078,380 A | 6/2000 | Taniguchi | |
| 6,885,433 B2* | 4/2005 | Shiraishi | G03F 7/70075 355/71 |
| 10,684,550 B2* | 6/2020 | Kobayashi | G02B 26/02 |
| 2001/0017939 A1 | 8/2001 | Yoshida | |

(Continued)

FOREIGN PATENT DOCUMENTS

| | | |
|---|---|---|
| JP | S6477123 A | 3/1989 |
| JP | 2014 179446 A | 9/2014 |
| WO | 20190146448 A1 | 8/2019 |

*Primary Examiner* — Seung C Sohn
(74) *Attorney, Agent, or Firm* — CANON U.S.A., INC. IP Division

(57) ABSTRACT

An exposure apparatus that exposes a substrate to light by using an original in which a pattern is formed includes an illumination optical system arranged to guide illumination light to the original, the illumination light including first illumination light with a first wavelength and second illumination light with a second wavelength different from the first wavelength, and a projection optical system arranged to form a pattern image of the original by using the illumination light at a plurality of positions in an optical axis direction. The illumination optical system is configured to adjust a position deviation in a direction perpendicular to the optical axis direction between a pattern image formed by the first illumination light and a pattern image formed by the second illumination light by changing an incident angle of the illumination light entering the original.

16 Claims, 12 Drawing Sheets

(56) References Cited

U.S. PATENT DOCUMENTS

2003/0133099 A1    7/2003   Shiode
2006/0038254 A1    2/2006   Jin
2011/0269259 A1   11/2011   Tatani

* cited by examiner

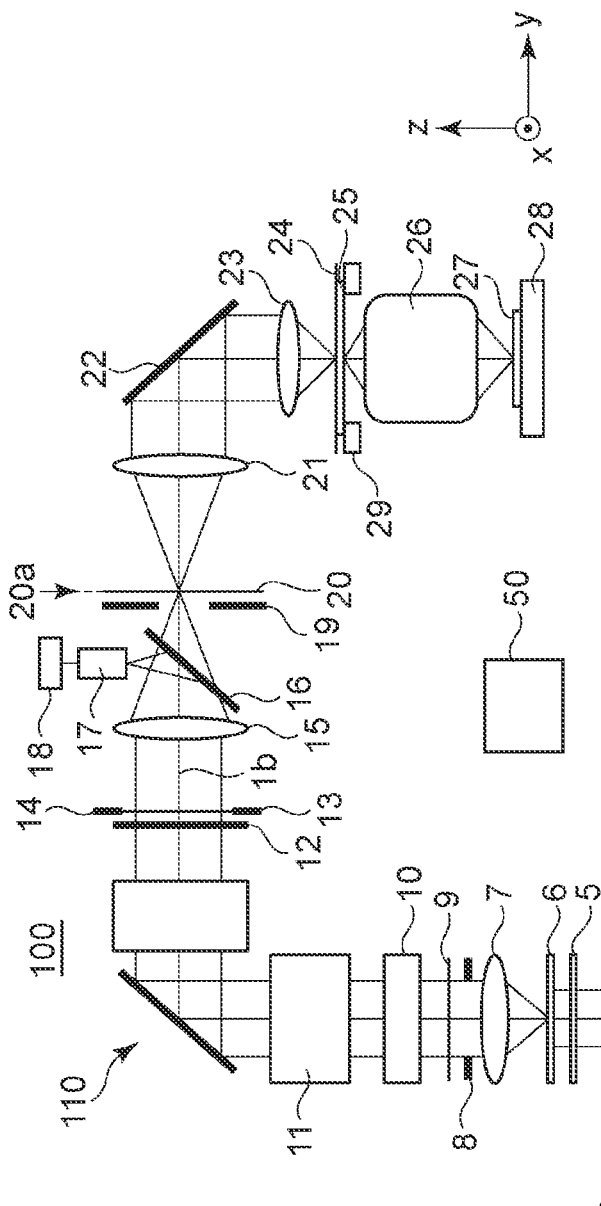
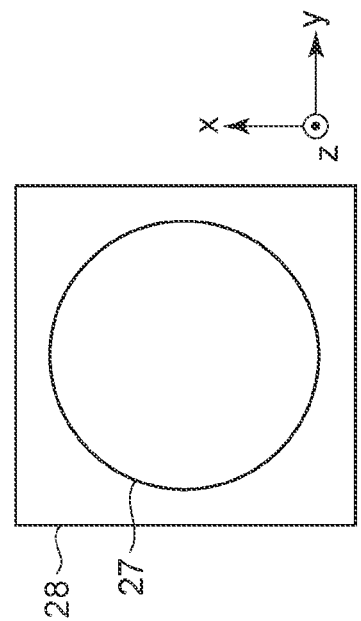
FIG. 1A
FIG. 1B

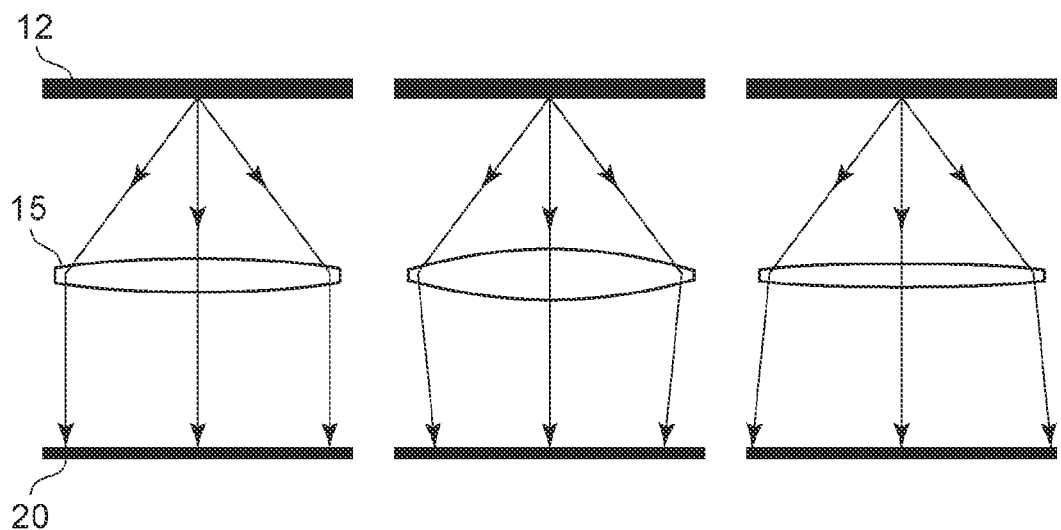

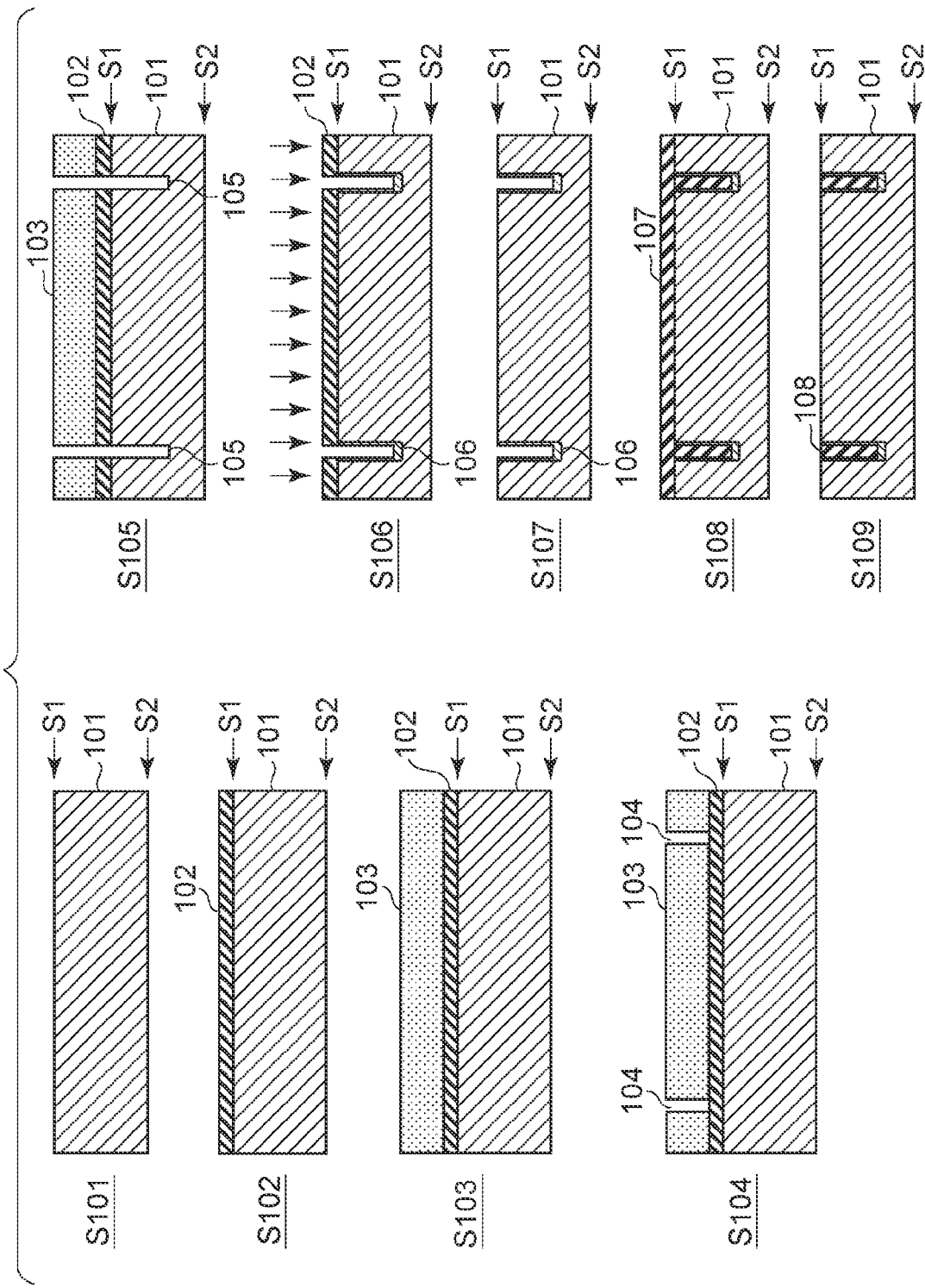

EXPOSURE APPARATUS, EXPOSURE METHOD, AND MANUFACTURING METHOD FOR PRODUCT

BACKGROUND OF THE INVENTION

Field of the Invention

The present invention relates to an exposure apparatus, an exposure method, and a manufacturing method for a product.

Description of the Related Art

An exposure apparatus is used in manufacturing a product, such as a semiconductor device. The exposure apparatus exposes a substrate to light by illuminating an original (a reticle or a mask) with an illumination optical system and projecting the pattern of the original onto the substrate via a projection optical system. In the exposure apparatus, a pattern image of the original is formed in a resist disposed on the substrate, and then etching or the like is performed, with the result that a desired pattern is formed on the substrate.

The thickness of a resist used varies depending on a pattern to be formed on the substrate, and a process in which the thickness of a resist film used is thick may be referred to as thick film process. In the thick film process, to highly accurately form a pattern image in a resist, the depth of focus of the projection optical system included in the exposure apparatus is desired to be expanded.

Japanese Patent Laid-Open No. 64-077123 describes contents related to multiwavelength exposure for performing exposure with the wavelength of a light source, such as an excimer laser, temporally divided into two by oscillating the light source at two different wavelengths. A pattern is able to be formed at different positions in the optical axis direction of the projection optical system under the influence of longitudinal chromatic aberration of the projection optical system.

Not only the longitudinal chromatic aberration but also lateral chromatic aberration also remains in the projection optical system described in Japanese Patent Laid-Open No. 64-077123. In an off-axis region, a pattern image can be formed at positions shifted in a direction perpendicular to the optical axis direction by rays of light with two different wavelengths. Thus, a pattern image formed in a resist has an inclination, which may lead to a decrease in pattern formation accuracy.

SUMMARY OF THE INVENTION

According to embodiments of the present invention, an exposure apparatus exposes a substrate to light by using an original in which a pattern is formed. The exposure apparatus includes an illumination optical system arranged to guide illumination light to the original, the illumination light including first illumination light with a first wavelength and second illumination light with a second wavelength different from the first wavelength, and a projection optical system arranged to form a pattern image of the original by using the illumination light at a plurality of positions in an optical axis direction of the projection optical system. The illumination optical system is configured to adjust a position deviation in a direction perpendicular to the optical axis direction between a pattern image formed by the first illumination light and a pattern image formed by the second illumination light by changing an incident angle of the illumination light entering the original.

Further features of the present invention will become apparent from the following description of embodiments with reference to the attached drawings.

BRIEF DESCRIPTION OF THE DRAWINGS

FIGS. 1A and 1B are diagrams that show the configuration of an exposure apparatus.

FIGS. 8A to 8C are diagrams that each show a method of adjusting the telecentricity of an illumination light beam.

FIG. 12 is a diagram that shows a manufacturing process for a semiconductor device.

DESCRIPTION OF THE EMBODIMENTS

Figure 2:
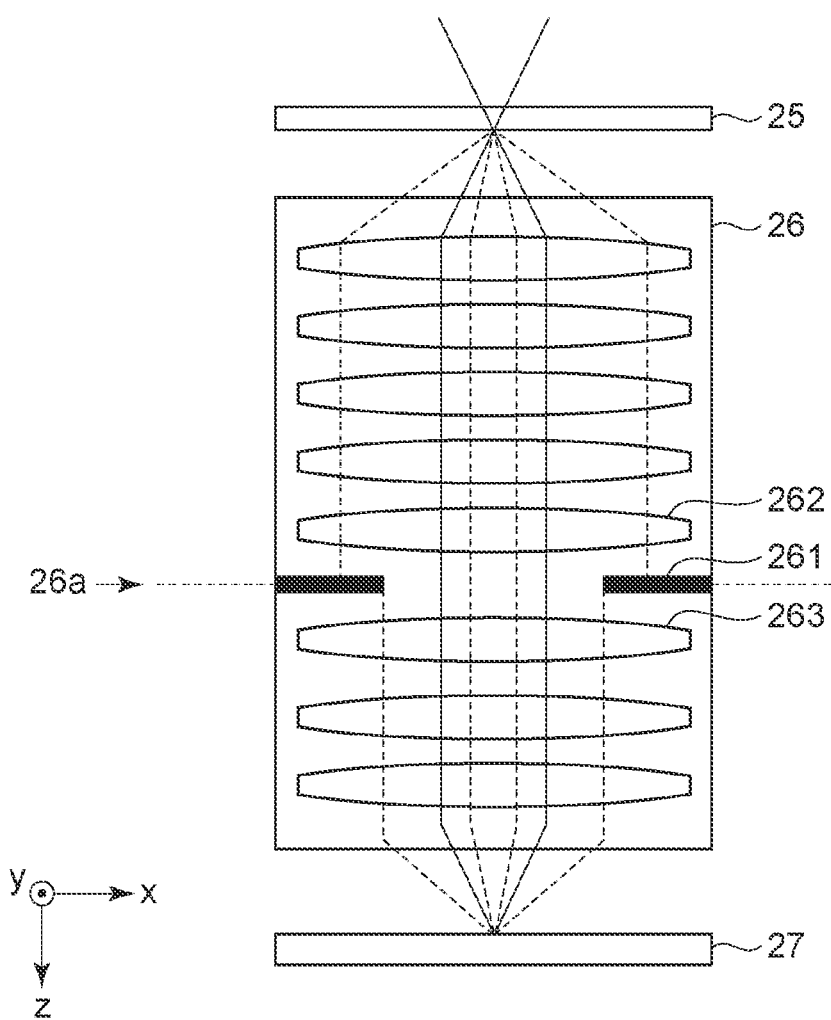
FIG. 2 is a diagram that schematically shows the cross section of a projection optical system.

Hereinafter, embodiments will be described with reference to the attached drawings. The following embodiments are not intended to limit the invention according to the claims. A plurality of features is described in each embodiment; however, not all the plurality of features is indispensable to the invention, and the plurality of features may be used in any combination. Like reference signs denote the identical or similar components in the attached drawings, and the repeated description is omitted.

FIG. 1A is a diagram that shows the configuration of an exposure apparatus 100 that is one aspect of the present invention. FIG. 1B is a simplified cross-sectional view of the exposure apparatus 100. The exposure apparatus 100 is a lithography apparatus that is used in a manufacturing process for a semiconductor device or the like and that forms a pattern on a substrate. In the present embodiment, the exposure apparatus 100 is a step-and-scan exposure apparatus (scanner) that transfers the pattern of an original 25 onto a substrate 27 by exposing the substrate 27 to light while moving the original 25 and the substrate 27 in a scanning direction (scanning exposure). However, the exposure apparatus 100 is able to adopt a step-and-repeat system or another exposure system.

As shown in FIGS. 1A and 1B, the exposure apparatus 100 includes an illumination optical system 110 that illuminates an original 25 (a reticle or a mask) with light from a light source 1 and a projection optical system 26 that projects the pattern of the original 25 onto a substrate 27 (a wafer, a glass plate, or the like). The exposure apparatus 100 includes an original stage 29, a substrate stage 28, and a control unit 50. The substrate stage 28 has a function of moving in a first direction and a second direction orthogonal to each other in a substrate plane. In the present embodiment, as shown in FIGS. 1A and 1B, with reference to the substrate stage 28, a coordinate system in which the first direction is a y direction (y-axis), the second direction is an x direction (x-axis), and a direction orthogonal to the first direction and the second direction is a z direction (z-axis) is defined. The z direction is a direction that corresponds to the optical axis direction of the projection optical system 26.

The light source 1 includes a mercury lamp with a wavelength of about 365 nm, an excimer laser, such as a KrF excimer laser with a wavelength of about 248 nm and an ArF excimer laser with a wavelength of about 193 nm. The light source 1 emits light (exposure light) for illuminating the original 25.

The illumination optical system 110 includes a relay optical system 2, an exit angle preserving optical element 5, a diffractive optical element 6, a condenser lens 7, a light shielding member 8, a prism unit 10, and a zoom lens unit 11. The illumination optical system 110 further includes an optical integrator 12, a diaphragm 13, a condenser lens 15, a light shielding unit 19, a masking unit 20, a condenser lens 21, and a collimator lens 23.

The relay optical system 2 is provided between the light source 1 and the exit angle preserving optical element 5. The relay optical system 2 guides light from the light source 1 to the exit angle preserving optical element 5. The exit angle preserving optical element 5 is provided on the light source side of the diffractive optical element 6. The exit angle preserving optical element 5 includes an optical integrator, such as a fly-eye lens, a microlens array, and a fiber bundle. The exit angle preserving optical element 5 guides light from the light source 1 to the diffractive optical element 6 while keeping the divergent angle constant. The exit angle preserving optical element 5 reduces the influence of fluctuations in the output of the light source 1 on a light intensity distribution (pattern distribution) formed by the diffractive optical element 6.

The diffractive optical element 6 is disposed in a plane that has a Fourier transform relationship with a pupil plane 14 of the illumination optical system 110. The diffractive optical element 6 forms a desired light intensity distribution on the pupil plane 14 of the illumination optical system 110, which is a plane conjugate with the pupil plane of the projection optical system 26, or a plane conjugate with the pupil plane 14 of the illumination optical system 110 by converting the light intensity distribution of light from the light source 1 by the diffraction effect. The diffractive optical element 6 may be made up of a computer generated hologram (CGH) designed by a computer such that a desired diffraction pattern is obtained on a diffraction pattern plane. In the present embodiment, a light source shape formed on the pupil plane of the projection optical system 26 is referred to as effective light source shape. The term "effective light source" means a light intensity distribution or a light angle distribution in an illuminated plane and a plane conjugate with the illuminated plane. The diffractive optical element 6 is provided between the exit angle preserving optical element 5 and the condenser lens 7.

A plurality of the diffractive optical elements 6 may be provided in the illumination optical system 110. For example, each of the plurality of diffractive optical elements 6 is attached to one of a plurality of slots of a turret (not shown). The diffractive optical elements 6 respectively form different effective light source shapes. These effective light source shapes include a small circular shape (relatively small circular shape), a large circular shape (relatively large circular shape), an annular shape, a dipole shape, a quadrupole shape, and other shapes. A method of illuminating an illuminated plane with an effective light source shape of an annular shape, a dipole shape, or a quadrupole shape is called modified illumination.

Light from the exit angle preserving optical element 5 is diffracted by the diffractive optical element 6 and guided to the condenser lens 7. The condenser lens 7 is provided between the diffractive optical element 6 and the prism unit 10. The condenser lens 7 condenses light diffracted by the diffractive optical element 6 and forms a distribution pattern (light intensity distribution) in a Fourier transform plane 9.

The Fourier transform plane 9 is a plane located between the optical integrator 12 and the diffractive optical element 6 and having an optically Fourier transform relationship with the diffractive optical element 6. By replacing the diffractive optical element 6 disposed in the optical path of the illumination optical system 110, it is possible to change the shape of the distribution pattern formed in the Fourier transform plane 9.

The light shielding member 8 is configured to be movable in a direction perpendicular to the optical axis 1b of the illumination optical system 110 and is disposed on the upstream side (light source side) of the Fourier transform plane 9. The light shielding member 8 is disposed at a position slightly spaced apart (defocused) from the position of the Fourier transform plane 9.

The prism unit 10 and the zoom lens unit 11 are provided between the Fourier transform plane 9 and the optical integrator 12. The prism unit 10 and the zoom lens unit 11 function as a zoom optical system that magnifies the light intensity distribution formed in the Fourier transform plane 9. The prism unit 10 adjusts the annular ratio and the like of the light intensity distribution formed in the Fourier transform plane 9 and guides the light intensity distribution to the zoom lens unit 11. The zoom lens unit 11 is provided between the prism unit 10 and the optical integrator 12. The zoom lens unit 11 includes, for example, a plurality of zoom lenses. The zoom lens unit 11 adjusts the σ value, which is obtained with reference to the ratio between the numerical aperture (NA) of the illumination optical system 110 and the NA of the projection optical system 26, of the light intensity distribution formed in the Fourier transform plane 9 and guides the light intensity distribution to the optical integrator 12.

The optical integrator 12 is provided between the zoom lens unit 11 and the condenser lens 15. The optical integrator 12 includes a fly-eye lens that forms a large number of secondary light sources and guides the secondary light sources to the condenser lens 15 according to the light intensity distribution of which the annular ratio, the aperture angle, and the σ value are adjusted. However, the optical integrator 12 may include another optical element, such as an optical pipe, a diffractive optical element, and a microlens array, instead of a fly-eye lens. The optical integrator 12 uniformly illuminates the original 25 placed in the illuminated plane 24 with light having passed through the diffractive optical element 6. The diaphragm 13 is provided near the pupil plane 14 of the illumination optical system 110 between the optical integrator 12 and the condenser lens 15.

The condenser lens 15 is provided between the optical integrator 12 and the original 25. Thus, the condenser lens 15 is able to condense a large number of rays of light guided from the optical integrator 12 and illuminate the original 25 in a superimposed manner. When a ray is caused to enter the optical integrator 12 and is condensed by the condenser lens 15, a conjugate plane 20a that is the focal plane of the condenser lens 15 is illuminated in substantially a rectangular shape.

A half mirror 16 is disposed on the rear side of the condenser lens 15. Part of exposure light reflected on the half mirror 16 enters a light intensity measurement optical system 17. A sensor 18 that measures the light intensity is disposed on the rear side of the light intensity measurement optical system 17. Light exposure during execution of exposure is appropriately controlled in accordance with the light intensity measured by the sensor 18.

The masking unit 20 that includes an X blade and a Y blade is disposed in a conjugate plane 20a that is a plane conjugate with the illuminated plane 24 and is illuminated with a substantially rectangular light intensity distribution. The masking unit 20 is disposed to define the illumination range of the original 25 (illuminated plane 24) and is scanned in synchronism with the original stage 29 and the substrate stage 28. The original stage 29 is a stage that moves while holding the original 25. The substrate stage 28 is a stage that moves while holding the substrate 27.

The light shielding unit 19 is provided at a position spaced apart (defocused) from the masking unit 20 (the conjugate plane 20a of the illuminated plane 24). Light reflected on a mirror 22 having a predetermined inclination with respect to a light beam from the condenser lens 21 illuminates the original 25 via the collimator lens 23.

The projection optical system 26 projects the pattern of the original 25 onto the substrate 27. FIG. 2 is a diagram that schematically shows the cross section of the projection optical system 26. As shown in FIG. 2, the projection optical system 26 includes a plurality of optical members (optical elements, such as lenses and mirrors). An aperture diaphragm 261 with a variable aperture diameter is provided at the pupil plane 26a of the projection optical system 26 or near the pupil plane 26a. By adjusting the aperture diameter of the aperture diaphragm 261, it is possible to set the NA of the projection optical system 26 to a desired value. The resolution of a pattern image of the original 25 depends on the NA and effective light source shape of the projection optical system 26. Therefore, by appropriately setting (selecting) the NA and effective light source shape of the projection optical system 26, it is possible to improve the resolution of the pattern of the original 25.

With regard to the material of the optical members that make up the projection optical system 26, a usable material is limited according to the wavelength of exposure light to be emitted from a light source. When a mercury lamp with a wavelength of about 365 nm is used as the light source, it is possible to favorably correct the longitudinal chromatic aberration, the lateral chromatic aberration, and the like by combining the optical members made of materials of about 10 types. On the other hand, when an excimer laser, such as a KrF excimer laser with a wavelength of about 248 nm and an ArF excimer laser with a wavelength of about 193 nm, is used as the light source, a material that transmits exposure light from the excimer lasers is limited. In consideration of the optical transparency and cost of the excimer lasers, a projection optical system is generally made of only a quartz in a current state. In this case, it is difficult to favorably correct the chromatic aberration with the optical design of a projection optical system, so the influence of the chromatic aberration of the projection optical system is reduced by narrowing of range of the wavelength spectrum of laser.

The description is back to FIGS. 1A and 1B. The control unit 50 is made up of a computer (information processing apparatus) that includes a CPU, a memory, and the like. The control unit 50 operates the exposure apparatus 100 by generally controlling the units of the exposure apparatus 100 in accordance with a program stored in the memory. The control unit 50 controls an exposure process of exposing the substrate 27 to light and various processes related to the exposure process. For example, in the present embodiment, the control unit 50 executes a process of determining an illumination shape (illumination light beam) for illumination with the pattern of the original 25.

In recent years, in a manufacturing process for a three-dimensional memory or an image pickup element, it is desired to form a penetration pattern with a thickness of several micrometers to several tens of micrometers. To form such a thick penetration pattern with an exposure apparatus, it is desired to expand the depth of focus of a projection optical system. As a technology for substantially expanding the depth of focus, there is known a method of performing multiple exposure while shifting the focus position in the optical axis direction of the projection optical system. As an example of multiple exposure, a focus latitude enhancement exposure (FLEX) method is known. In the FLEX method, scanning exposure is, for example, performed while a substrate is inclined with respect to the optical axis of the projection optical system such that points in a region on the substrate are exposed to light in a two or higher defocus state. As another example of multiple exposure, a resolution enhancement by laser-spectrum adjusted exposure (RELAX) method is known. In the RELAX method, the wavelength spectrum of a laser light source is adjusted so as to have a light intensity peak at a plurality of wavelengths.

Rays of light with different wavelengths respectively form images at positions different in the optical axis direction of the projection optical system under the influence of optical characteristics including longitudinal chromatic aberration, coma chromatic aberration, and the like remaining in the projection optical system. By adjusting the wavelength spectrum of the laser light source, it is possible to change the image forming position in the optical axis direction, with the result that the effect of expanding the depth of focus is obtained.

In this way, in the RELAX method, the effect of expanding the depth of focus is obtained by using longitudinal chromatic aberration remaining in the projection optical system; however, aberrations such as lateral chromatic aberration and comatic aberration, other than the longitudinal chromatic aberration, remain in the projection optical system, and these aberrations may lead to a decrease in image forming performance.

Figure 3:
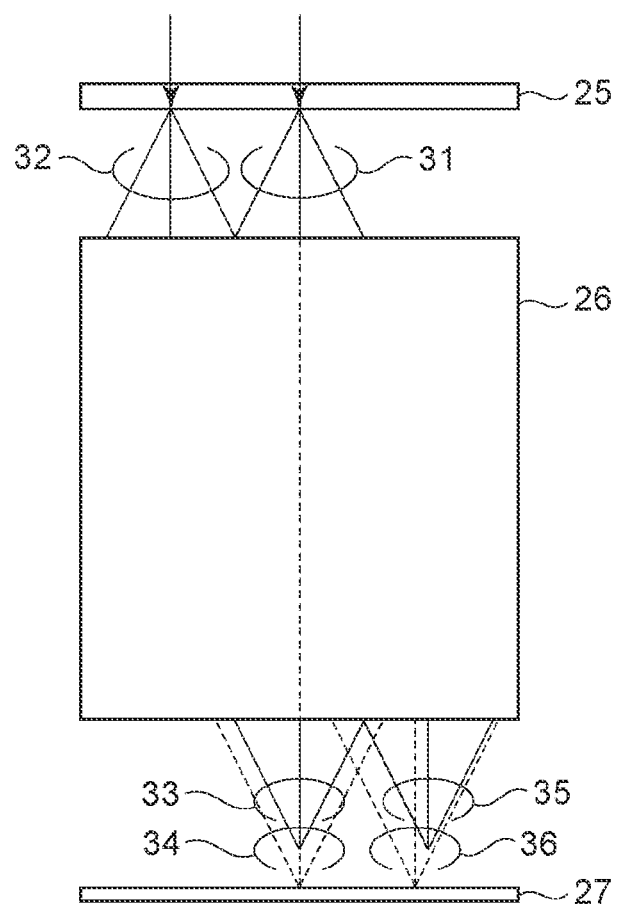
FIG. 3 is a diagram that shows a position deviation between pattern images.

FIG. 3 is a schematic diagram that shows the influence of the lateral chromatic aberration of the projection optical system on image forming performance FIG. 3 shows a state where illumination light beams having transmitted through the original 25 pass through the projection optical system 26 and reach the substrate 27. In FIG. 3, a light beam 31 from an on-axis object point of the original 25 and a light beam 32 from an off-axis object point of the original 25 are drawn. The light beam 31 from the on-axis object point becomes a light beam 33 that converges at an on-axis image point, and the light beam 32 from the off-axis object point becomes a light beam 35 that converges at an off-axis image point.

Here, when the wavelength spectrum of a light beam from the original 25 includes a plurality of peaks, an image forming position varies according to a wavelength even for a light beam emitted from the same object point. Here, it is assumed that the wavelength spectrum has a peak at a first wavelength and a peak at a second wavelength different from the first wavelength.

With regard to the light beam 31 from the on-axis object point, a light beam with the first wavelength (first illumination light) passes through the projection optical system 26 and becomes the light beam 33 and converges, and a light beam with the second wavelength (second illumination light) becomes the light beam 34 under the influence of the longitudinal chromatic aberration of the projection optical system 26 and converges. The image forming position of the light beam 33 in the optical axis direction and the image forming position of the light beam 34 in the optical axis direction are different from each other. With regard to the on-axis light beam, there is almost no influence of the lateral chromatic aberration, so the image forming positions of both are different only in the optical axis direction.

On the other hand, with regard to the light beam 32 from the off-axis object point, a light beam with the first wavelength passes through the projection optical system 26 and becomes the light beam 35 and converges, and a light beam with the second wavelength becomes the light beam 36 under the influence of the longitudinal chromatic aberration and the lateral chromatic aberration of the projection optical system 26 and converges. The image forming position of the light beam 35 and the image forming position of the light beam 36 are different from each other not only in the optical axis direction of the projection optical system 26 but also in a direction perpendicular to the optical axis direction. In other words, there occurs a position deviation both in the optical axis direction of the projection optical system 26 and in the direction perpendicular to the optical axis direction between a pattern image formed by the light beam 35 (first illumination light) and a pattern image formed by the light beam 36 (second illumination light).

As described above, with regard to an off-axis light beam, a straight line connecting the light condensing position of the first illumination light with the light condensing position of the second illumination light is not perpendicular to the substrate 27. Therefore, a pattern image is formed obliquely with respect to a resist, with the result that an inclination can occur in the penetration pattern on the substrate 27. The inclination of the pattern image occurs mainly in proportion to the ratio T/L of the lateral chromatic aberration T to the longitudinal chromatic aberration L.

Since a position deviation of a pattern image due to the lateral chromatic aberration is proportion to a distance between an image point and an optical axis, the inclination of the pattern image increases with distance of an image point from the optical axis.

The inclination of a pattern due to the lateral chromatic aberration occurs in a direction in which an image is shifted by the lateral chromatic aberration. In other words, the inclination of a pattern occurs in a radiation direction with respect to the intersection point between an image plane and the optical axis of the projection optical system 26. A step-and-scan exposure apparatus (scanner) performs exposure by scanning a slit-shaped exposure region. In other words, a region to be used for exposure in the image plane of the projection optical system 26 has a long slender slit shape. Therefore, how the influence of the lateral chromatic aberration appears, that is, how the inclination of a pattern appears, varies depending on the direction of a pattern. Specifically, an inclination occurs in a pattern extended in a transverse direction with respect to the slit-shaped exposure region, and no inclination occurs in a pattern extended in a longitudinal direction. it is noted that an inclination varies depending on the direction of a pattern. When the inclination of a pattern is greater than or equal to an allowable value, it may be a cause of device defect, and yield can decrease.

Figure 4:
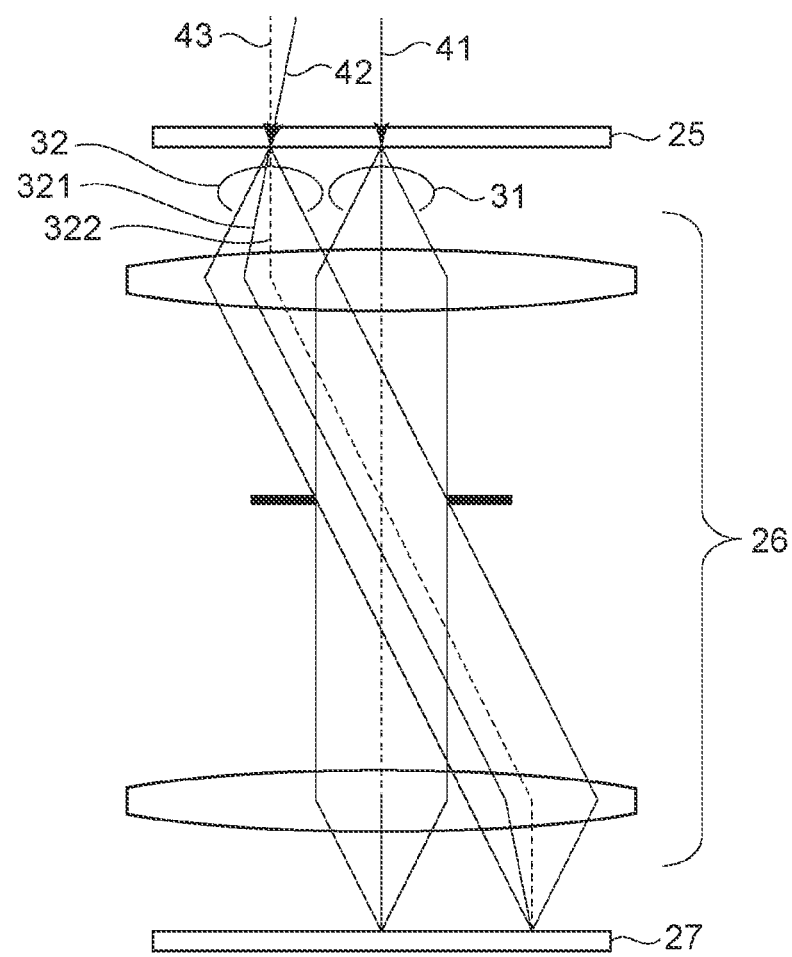
FIG. 4 is a diagram that shows an optical path of a principal ray before and after adjustment of telecentricity.

In the present embodiment, to correct the inclination of a pattern image due to a position deviation between the light condensing position of the light beam with the first wavelength and the light condensing position of the light beam with the second wavelength, the inclination of the illumination light beam is adjusted. Hereinafter, the operation to adjust the inclination of an illumination light beam is referred to as telecentricity adjustment. FIG. 4 shows a state where light beams from the original 25 pass through the projection optical system 26 and reach the substrate 27. In FIG. 4, rays 41, 42, 43 respectively represent principal rays of illumination light beams that illuminate the original 25. The principal ray 41 illuminates an on-axis object point. The principal rays 42, 43 illuminate an off-axis object point. The principal ray 43 travels as represented by a ray 322 inside the projection optical system 26, becomes a ray substantially perpendicular to the substrate 27, and reaches an image point. The principal ray 42 travels as represented by a ray 321 inside the projection optical system 26, becomes a ray inclined from the direction perpendicular to the substrate 27, and reaches the image point. In this way, by changing the inclination of a principal ray that enters the original 25, it is possible to adjust the inclination of a light beam to be condensed on the substrate 27, with the result that the effect of inclining a pattern image is obtained. In other words, it is possible to reduce the inclination of a pattern by appropriately controlling the inclination amount of a pattern image with the RELAX method and the inclination amount of a pattern image with telecentricity adjustment.

Figures 5A, 5B, 5C:
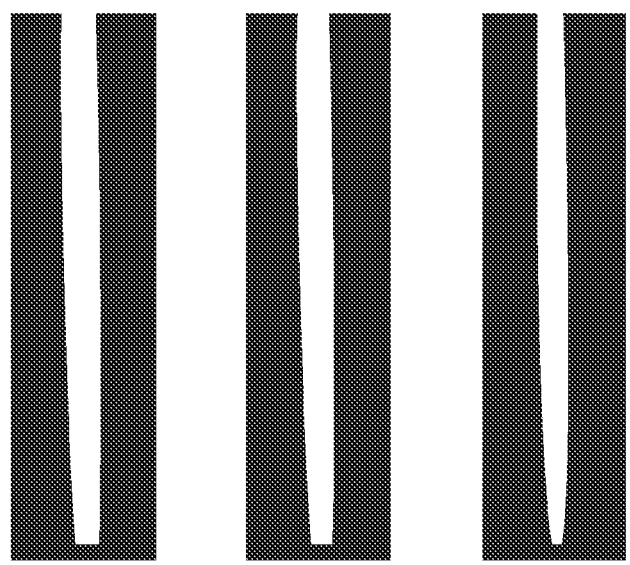
FIGS. 5A to 5C are diagrams that each show an inclination of a pattern image.

FIGS. 5A to 5C are diagrams that show that the inclination of a pattern is reduced by telecentricity adjustment. FIGS. 5A to 5C each show the shape of a pattern image to be formed by an off-axis light beam. These pattern images are obtained by simulation. The results are obtained by simulation under illumination conditions that NA=0.55, σ=0.50, a pattern has a trench with a diameter of 200 nm, and the thickness of a resist is 4 μm. Here, σ is a value with reference to the ratio between the numerical aperture (NA) of the illumination optical system 110 and the NA of the projection optical system 26.

FIG. 5A shows the result in the case where the telecentricity is not adjusted. FIG. 5B shows the result in the case where the telecentricity is adjusted by 0.05. FIG. 5C shows the result in the case where the telecentricity is adjusted by 0.10.

Here, adjusting the telecentricity by 0.05 means that, where an inclination angle from the optical axis direction of the projection optical system 26 is θ, the inclination of an illumination light beam is adjusted by θ=arctan 0.05. As shown in FIGS. 5A to 5C, it appears that the inclination of the pattern reduces as the inclination of an illumination light beam is increased.

Figure 6:
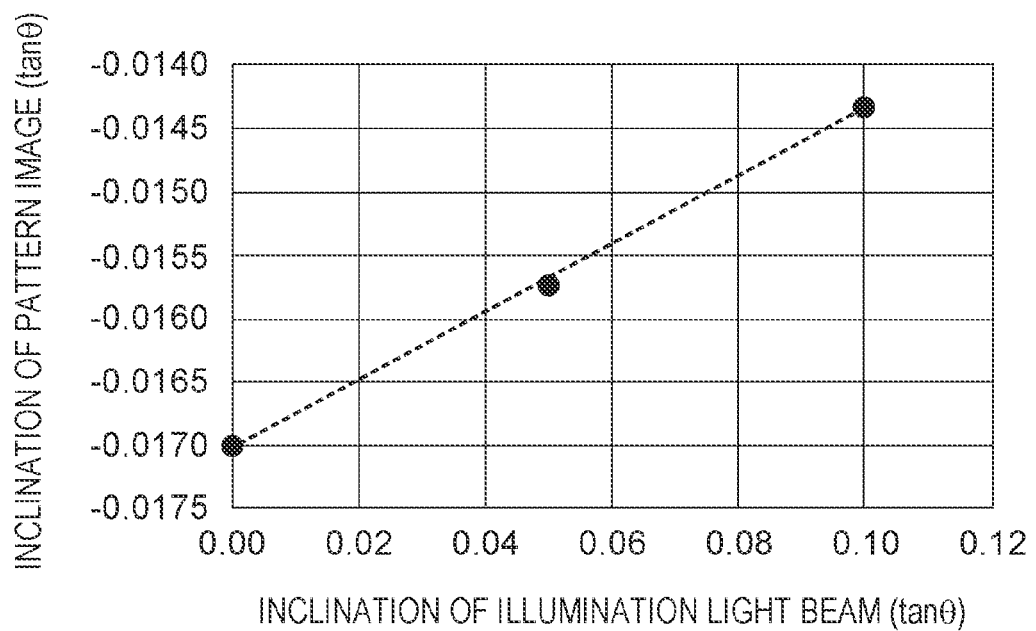
FIG. 6 is a graph that shows the relationship between the inclination of an illumination light beam and the inclination of a pattern image.

FIG. 6 is a graph that shows the relationship between the inclination of an illumination light beam and the inclination of a pattern image. The inclination of a pattern image is described as the inclination of a straight line obtained by performing linear regression on middle points of right and left walls of a pattern image. As the inclination of an illumination light beam increases, the inclination of the straight line reduces, so the inclination of a pattern image is reduced. Here, the relationship between the inclination of an illumination light beam and the inclination of a pattern image is obtained by simulation. Alternatively, such a relationship may be obtained in accordance with the results of actual pattern formation.

Figure 7A:
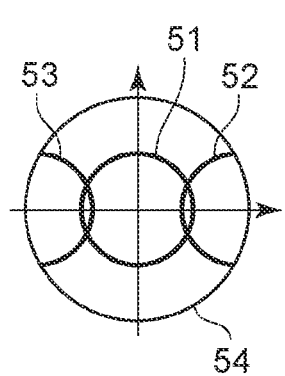
FIGS. 7A to 7C are diagrams that each show a light intensity distribution in a pupil plane of the projection optical system.
Figure 7B:
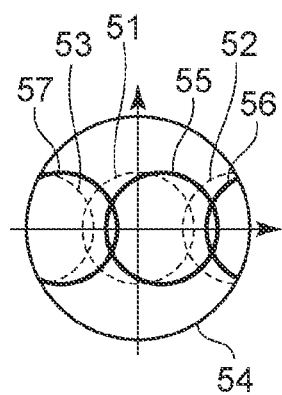
Figure 7C:
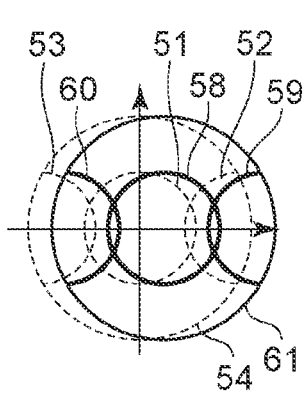

The relationship between the inclination of an illumination light beam and the inclination of a pattern image changes depending on a pattern shape. This will be described with reference to FIGS. 7A to 7C. FIGS. 7A to 7C each show a light intensity distribution to be formed by a light beam from an off-axis object point in the original 25 and each show a light intensity distribution in the pupil plane of the projection optical system 26. FIG. 7A shows a light intensity distribution when exposure is performed by using a light beam having one peak in a wavelength spectrum. Reference sign 54 indicates a pupil determined by the aperture diaphragm of the projection optical system 26. Reference numeral 51 indicates a zero-order diffracted light beam from the off-axis object point. Reference numerals 52 and 53 respectively indicate positive and negative first-order diffracted light beams formed from an illumination light beam diffracted by the pattern of the original 25.

In FIG. 7A, the light intensity distribution of the zero-order diffracted light beam is located at the pupil center, and the eclipses of the positive and negative first-order diffracted light beams in the pupil peripheral area are also bilaterally symmetric, so almost no position deviation of a pattern image occurs in an image plane even when defocus occurs in the projection optical system 26. In other words, a pattern image almost does not incline.

FIG. 7B shows a light intensity distribution when the inclination of an illumination light beam is adjusted from the state of FIG. 7A. Since the principal ray is caused to enter obliquely, the light intensity distribution 55 of the zero-order diffracted light beam in the pupil plane is shifted from the pupil center. Since the eclipses of the positive and negative first-order diffracted light beams 56, 57 in the pupil peripheral area are bilaterally asymmetric, the symmetry of the light intensity distribution in the pupil plane is decreased. Therefore, when defocus has occurred in the projection optical system 26, a position deviation of a pattern image occurs in an image plane, and the pattern image inclines.

A manner of occurrence of a diffracted light beam changes according to the shape of the pattern (for example, a pattern pitch, the ratio of line to space, the arrangement direction of the pattern in a line-and-space pattern) of the original 25, and eclipses in the pupil peripheral area also change. Thus, the asymmetry of the light intensity distribution in the pupil plane also changes, so the light intensity centroid also similarly changes. This means that there occurs a difference in the amount of position deviation of a pattern image in the image plane in the case where there occurs defocus in the projection optical system 26. Thus, it appears that the easiness of adjusting the inclination of a pattern varies depending on the pattern shape of the original 25.

Next, a method of adjusting the telecentricity of an illumination light beam will be described with reference to FIGS. 8A to 8C. FIGS. 8A to 8C are simple diagrams that each show part of the illumination optical system 110. In FIGS. 8A to 8C, an optical path from the optical integrator 12 to the conjugate plane 20a that is a plane conjugate with the original 25 is extracted and shown. The plane of exit of the optical integrator 12 and the conjugate plane 20a are in a relationship between an image and a pupil via the condenser lens 15 (Fourier transform relationship).

FIG. 8A shows a reference state in which light emitted from one point of the optical integrator 12 enters the conjugate plane 20a substantially perpendicularly. In FIGS. 8A to 8C, the condenser lens 15 is drawn as a single lens, and is actually made up of a plurality of lenses. By moving part of the lenses that make up the condenser lens 15 for zoom magnification, it is possible to change the focal length of the overall condenser lens 15. When the focal length of the condenser lens 15 is shortened as compared to the reference state, an off-axis light beam enters the conjugate plane 20a so as to approach the optical axis as shown in FIG. 8B. On the other hand, when the focal length of the condenser lens 15 is extended as compared to the reference state, an off-axis light beam enters the conjugate plane 20a so as to move away from the optical axis as shown in FIG. 8C.

Since the conjugate plane 20a is a plane conjugate with an illuminated plane 24 (original 25), the light intensity distribution in this plane is the same as the light intensity distribution in the illuminated plane 24 (original 25).

As described above, by changing the zoom magnification state of the lenses included in the illumination optical system 110, it is possible to adjust the light intensity distribution in the illuminated plane 24 (original 25). In other words, it is also possible to adjust the inclination of a principal ray with which the original 25 is irradiated. In this way, by continuously changing the focal length of the condenser lens 15 with a zoom mechanism, it is also possible to continuously adjust the inclination amount of a principal ray.

As shown in FIGS. 8A to 8C, a change in the inclination of a ray increases with a distance from the optical axis, and the inclination of a pattern image that occurs due to the lateral chromatic aberration of the projection optical system 26 also increases with distance from the optical axis. Therefore, for adjusting the inclination of a pattern image due to the lateral chromatic aberration, a method of changing the zoom magnification state as shown in FIGS. 8A to 8C is suitable.

Figure 9:
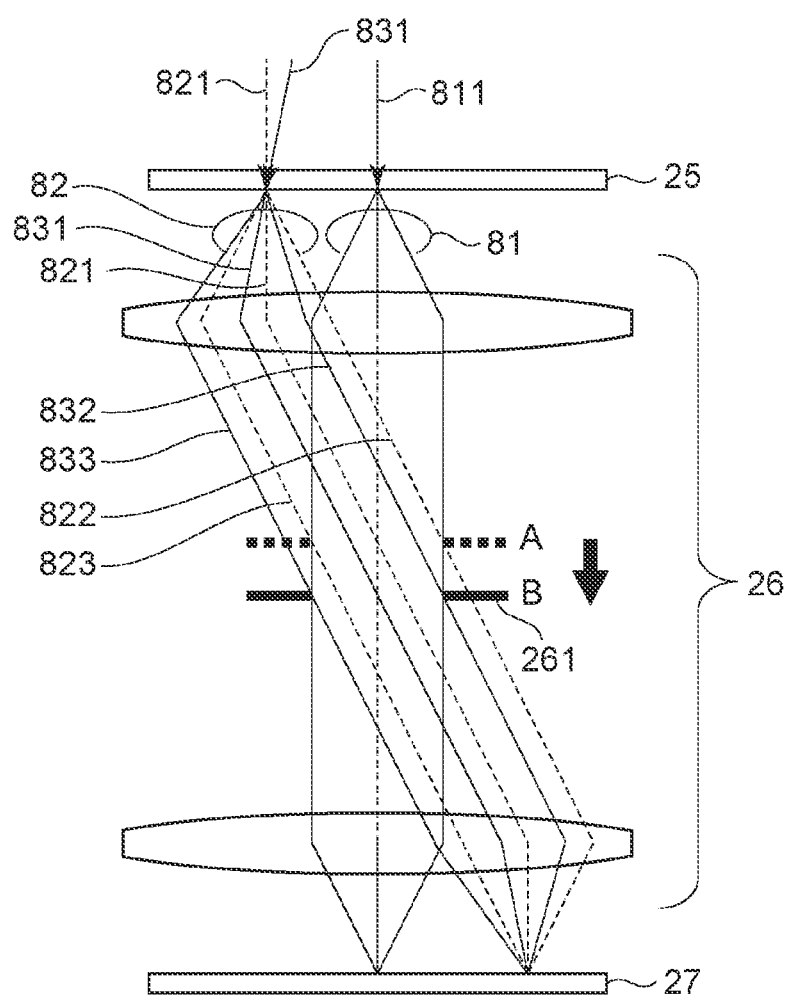
FIG. 9 is a diagram that shows an optical path of a principal ray before and after adjustment of an aperture diaphragm.

Next, a method of adjusting the inclination of a pattern image by controlling the aperture diaphragm 261 of the projection optical system 26 will be described with reference to FIG. 9. FIG. 9 shows a state where light beams from the original 25 pass through the projection optical system 26 and reach the substrate 27. Reference numeral 811 represents the principal ray of a light beam 81 that illuminates an on-axis object point. Reference numeral 82 represents a light beam that emits from an off-axis object point and reaches an off-axis image point.

A principal ray 811 of the light beam 81 that illuminates the on-axis object point and a principal ray 821 of the light beam 82 that illuminates the off-axis object point enter the original 25 substantially perpendicularly and also enter the substrate 27 substantially perpendicularly. With regard to marginal rays that pass through the end portion of the aperture diaphragm 261, a positive-side marginal ray 822 and a negative-side marginal ray 823 enter the substrate 27 at substantially the same angle of incidence. Therefore, a pattern image formed in a resist almost does not incline.

Here, as shown in FIG. 4, when telecentricity is adjusted to correct the inclination of the pattern, the principal ray 831 of the light beam 82 that illuminates the off-axis object point enters the original 25 in an oblique direction with respect to the optical axis and also enters the substrate 27 in an oblique direction with respect to the optical axis. The optical path of a marginal ray is determined by moving the position of the aperture diaphragm 261 from A to B and additionally changing the aperture diameter of the aperture diaphragm 261. As shown in FIG. 9, the positive-side marginal ray 832 and the negative-side marginal ray 833 enter the substrate 27 at mutually different angles. By appropriately setting the position and aperture diameter of the aperture diaphragm 261, the angle formed between the principal ray 831 and the positive-side marginal ray 832 and the angle formed between the principal ray 831 and the negative-side marginal ray 833 are able to be made substantially the same. By appropriately setting the optical paths of marginal rays in this way, it is possible to control the inclination of a pattern image while maintaining the uniformity of the pattern image.

A light intensity distribution in the pupil plane of the projection optical system 26 when the position and aperture diameter of the aperture diaphragm 261 of the projection optical system 26 are controlled will be described with reference to FIG. 7C. As in the case of FIG. 7B, since the principal ray is caused to enter obliquely, the light intensity distribution 58 of the zero-order diffracted light beam in the pupil plane is shifted from the pupil center. Since the position of the aperture diaphragm 261 is changed, a pupil region has shifted from the region 54 to a region 61. As a result, eclipses of the positive and negative first-order diffracted light beams 59, 60 in the pupil peripheral area are bilaterally symmetric with respect to the center of the light intensity distribution of the zero-order diffracted light beam. When FIG. 7A and FIG. 7C are compared with each other, the entire light intensity in the pupil plane has shifted, and a pattern formed in a resist shifts in a direction perpendicular to the optical axis direction of the projection optical system 26.

Figures 10A, 10B, 10C, 10D:
FIGS. 10A to 10D are diagrams that each show an inclination of a pattern image.

FIGS. 10A to 10D are diaphragms that show that the inclination of a pattern image is reduced by adjusting the telecentricity and adjusting the aperture diaphragm 261. FIGS. 10A to 10D each show the shape of a pattern image to be formed by an off-axis light beam. These pattern images are obtained by simulation. The results are obtained by simulation under illumination conditions that NA=0.55, σ=0.50, a pattern has a trench with a diameter of 200 nm, and the thickness of a resist is 4 μm. FIG. 10A shows the result in the case where the telecentricity and the aperture diaphragm 261 are not adjusted. FIG. 10B shows the result in the case where the telecentricity is adjusted by 0.05 and the aperture diaphragm 261 is adjusted accordingly. FIG. 10C shows the result in the case where the telecentricity is adjusted by 0.10 and the aperture diaphragm 261 is adjusted accordingly. FIG. 10D shows the result in the case where the telecentricity is adjusted by 0.15 and the aperture diaphragm 261 is adjusted accordingly.

It appears that the inclination of the pattern reduces as the inclination of an illumination light beam is increased.

Figure 11:
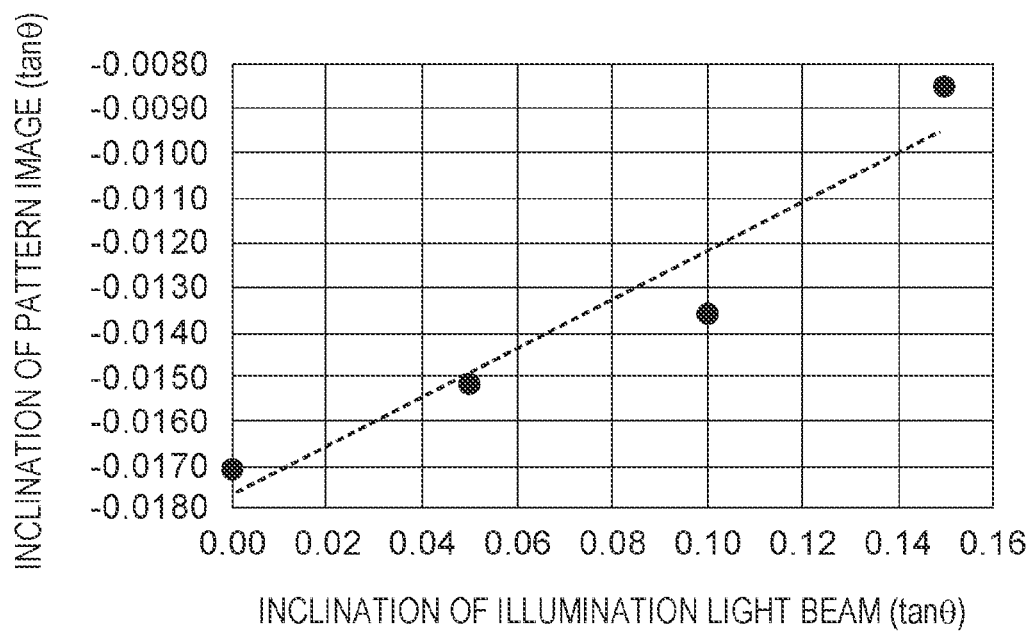
FIG. 11 is a graph that shows the relationship between the inclination of an illumination light beam and the inclination of a pattern image.

FIG. 11 is a graph that shows the relationship between the inclination of an illumination light beam and the inclination of a pattern image. The inclination of a pattern image is described as the inclination of a straight line obtained by performing linear regression on middle points of right and left walls of a pattern image. As the inclination of an illumination light beam increases, the inclination of the straight line reduces, so the inclination of a pattern image is reduced. Here, the relationship between the inclination of an illumination light beam and the inclination of a pattern image is obtained by simulation. Alternatively, such a relationship may be obtained in accordance with the results of actual pattern formation.

As described above, with the exposure apparatus of the present embodiment, it is possible to effectively reduce the inclination of a pattern image formed in a resist film by appropriately setting the inclination of an illumination light beam that illuminates the pattern.

Modifications

In FIG. 9, the position of the aperture diaphragm 261 is changed. Alternatively, a plurality of aperture diaphragms may be prepared, and aperture diaphragms with variable aperture diameters may be respectively disposed at both position A and position B. When a light beam is caused to enter the original 25 substantially perpendicularly, the diameter of the aperture diaphragm disposed at position B is increased to prevent an eclipse in a ray, and the diameter of the aperture diaphragm disposed at position A is appropriately set. When a light beam is caused to enter the original 25 obliquely, the diameter of the aperture diaphragm disposed at position A is increased to prevent an eclipse in a ray, and the diameter of the aperture diaphragm disposed at position B is appropriately set.

Exposure Mode in Exposure Apparatus

A manufacturing process for a semiconductor device, such as a memory and an image pickup element, includes a process of forming a pattern layer on a substrate. A pattern image is formed in a resist by using an exposure apparatus in the process, and a pattern layer including a trench is formed through etching and the like. The thickness of a resist used can vary depending on a pattern layer to be formed, and the depth of focus used in a projection optical system of an exposure apparatus also varies according to the thickness of a resist. When the thickness of a resist is thick, pattern formation can be performed by multiple exposure of the RELAX method or the like. In the RELAX method, the oscillating state of a laser light source needs to be controlled so as to have a light intensity peak at a plurality of wavelengths. On the other hand, when the thickness of a resist is thin, the oscillating state of the laser light source is controlled so as to have a light intensity peak at a single wavelength.

In this way, the depth of focus and the like of the projection optical system need to be changed for each layer to be formed on a substrate, so the exposure mode in an exposure apparatus can be switchable as needed. For example, it is conceivable to switch the oscillating state of the laser light source according to the exposure mode. To switch the oscillating state of the laser light source, a mechanism capable of switching the oscillating state is provided in the light source. The exposure apparatus is capable of switching the oscillating state of the laser light source in accordance with a recipe in which various parameters during execution of exposure are set.

For example, the exposure mode is able to be switched between a first mode and a second mode. The first mode is a mode to perform exposure by controlling the oscillating state of the laser light source so as to have a light intensity peak at a single wavelength (reference wavelength). The second mode is a mode to perform exposure with illumination light that includes first illumination light with a first wavelength different from the reference wavelength and second illumination light with a second wavelength different from the reference wavelength or the first wavelength. It is possible to reduce occurrence of the inclination of a pattern image in the second mode by varying the incident angle of an off-axis light beam to an original in the second mode and the incident angle of an off-axis light beam to an original in the first mode.

When exposure based on the RELAX method is performed in the second mode, the values of a plurality of wavelengths corresponding to light intensity peaks and a wavelength difference are designated, so these parameters can be set as one of setting items of a recipe. To adjust the inclination of an illumination light beam and the aperture diaphragm for exposure based on the RELAX method, the exposure apparatus may be configured to automatically perform the adjustment by using a recipe or a user may be asked to determine whether to perform the adjustment. When the exposure apparatus automatically performs the adjustment, the adjustment amount is determined in consideration of the features of a pattern, the telecentricity of an illumination light beam, and the like. At this time, the exposure apparatus can be configured to be able to acquire information on the features of the pattern of an original.

Manufacturing Method for Product

A method of manufacturing a semiconductor device (a memory or a photoelectric conversion device, such as an image pickup element) by using the exposure apparatus typically in the present embodiment will be described. The exposure apparatus of the present embodiment is suitably used in a manufacturing method for a semiconductor device, including a thick film process. A process of forming a pixel separation portion in an image pickup element (light source conversion device) is an example of the thick film process.

Hereinafter, the process of forming a pixel separation portion in the manufacturing process for an image pickup element will be described with reference to FIG. 12. In step S101, a semiconductor substrate 101 having a first surface S1 and a second surface S2 that are mutually opposite surfaces is prepared. The semiconductor substrate 101 is typically a silicon substrate or a silicon layer. Subsequently, in step S102, an insulating film (for example, a silicon oxide film) 102 is formed on the first surface S1 of the semiconductor substrate 101.

Subsequently, in step S103, a resist 103 is applied on the first surface S1 of the semiconductor substrate 101, more specifically, on the insulating film 102 on the first surface S1 of the semiconductor substrate 101. In addition, in step S104, as described in the above embodiment, by performing exposure operation in a state where the inclination of an illumination light beam is adjusted, a pattern image is formed in the resist 103, and grooves (trenches) 104 are formed through etching and the like. By reducing the inclination of a pattern image to be formed in the resist 103, it is possible to form the grooves 104 with a reduced inclination.

Subsequently, in step S105, by etching the semiconductor substrate 101 with a dry etching method or the like, grooves 105 are formed on the first surface S1 of the semiconductor substrate 101. To protect the first surface S1 of the semiconductor substrate 101 in this etching, thick application of the resist 103 is desired.

Subsequently, in step S106, the resist 103 is removed, and then gettering regions 106 are formed by implanting ions to the semiconductor substrate 101 through the grooves 105. In other words, in step S106, ions are implanted into the semiconductor substrate 101 through the grooves 105 in a state where a region of the first surface S1 of the semiconductor substrate 101, other than a region in which the grooves 105 are present, is masked with the insulating film 102. Each gettering region 106 can include a first part located under the bottom of the groove 105 and a second part located to the side of the groove 105. In an example, the concentration of a Group 14 element in the first part is higher than the concentration of a Group 14 element in the second part. Ions can be ions of a Group 14 element other than silicon when the semiconductor substrate 101 is a silicon substrate. An ion implantation device is used to implant ions. An acceleration energy to implant ions can be determined such that ions do not penetrate through the insulating film 102 as a hard mask and reach the semiconductor substrate 101. For example, when the thickness of the insulating film 102 at the time of implanting ions is 300 nm, ions almost do not penetrate through the insulating film 102 when the acceleration energy is about 20 keV.

When the semiconductor substrate 101 is a silicon substrate, a material that is a component of ions to be implanted into the semiconductor substrate 101 in step S106 is suitably carbon. Alternatively, hydrocarbons that are molecules including carbon may be adopted. When the semiconductor substrate 101 is a silicon substrate, a material that is a component of ions to be implanted into the semiconductor substrate 101 in step S106 may be germanium, tin, or lead. By implanting ions of carbon, germanium, tin, or lead into the silicon substrate serving as the semiconductor substrate 101, it is possible to impart a local strain in the silicon substrate and to cause the silicon substrate to function as a gettering site. By implanting ions into the semiconductor substrate 101 through the grooves 105, the gettering regions 106 are able to be formed at deep positions of the semiconductor substrate 101 even with relatively low acceleration energy.

Subsequently, in step S107, the insulating film 102 is removed. In step S108, an insulating film (for example, a silicon nitride film) 107 is formed in the grooves 105 and on the first surface S1 of the semiconductor substrate 101 by a film formation method, for example, low pressure CVD or the like such that an insulator is disposed or filled in the grooves 105. Subsequently, in step S109, part of the insulating film 107, present on the first surface S1 of the semiconductor substrate 101, is removed by CMP or the like. Thus, part of the insulating film 107, present in the grooves 105, remain as pixel separation portions 108 disposed or filled in the grooves 105.

Step S108 and step S109 are not necessarily performed. When step S108 and step S109 are not performed, the grooves 105 remain as air gaps, and the air gaps can function as pixel separation portions. The pixel separation portion 108 disposed in each groove 105 does not need to completely fill the groove 105, and an air gap may be present in the groove 105. The pixel separation portion 108 may be made up of only an insulator and may also be a structure of a combination of an insulator and a non-insulator (a semiconductor or a conductor). In this case, to avoid contact between the non-insulator and the semiconductor substrate 101, the insulator can be disposed between the non-insulator and the semiconductor substrate 101.

As described above, the pixel separation portions 108 are formed through a first formation step of forming the grooves 105 in the semiconductor substrate 101 and a second formation step of forming the pixel separation portions 108 in the grooves 105. After that, an electric charge storage region, a gate electrode, and the like are formed in a region between a plurality of pixel separation portions, with the result that an image pickup element is made.

While the present invention has been described with reference to embodiments, it is to be understood that the invention is not limited to the disclosed embodiments but is defined by the scope of the following claims.

This application claims the benefit of Japanese Patent Application No. 2021-104157, filed Jun. 23, 2021, which is hereby incorporated by reference herein in its entirety.

What is claimed is:

1. An exposure apparatus that exposes a substrate to light by using an original in which a pattern is formed, the exposure apparatus comprising:
    an illumination optical system arranged to guide illumination light to the original, the illumination light including first illumination light with a first wavelength and second illumination light with a second wavelength different from the first wavelength; and a projection optical system arranged to form a pattern image of the original by using the illumination light at a plurality of positions in an optical axis direction of the projection optical system, wherein the illumination optical system is configured to adjust a position deviation in a direction perpendicular to the optical axis direction between a pattern image formed by the first illumination light and a pattern image formed by the second illumination light by changing an incident angle of the illumination light entering the original.

2. The exposure apparatus according to claim 1, wherein the illumination optical system is configured to change the incident angle in accordance with an optical characteristic of the projection optical system.

3. The exposure apparatus according to claim 2, wherein the optical characteristic is a lateral chromatic aberration.

4. The exposure apparatus according to claim 2, wherein the optical characteristic is a comatic aberration.

5. The exposure apparatus according to claim 3, wherein the incident angle is changed so as to reduce the position deviation due to the lateral chromatic aberration of the projection optical system.

6. The exposure apparatus according to claim 4, wherein the incident angle is changed so as to reduce a position deviation due to the comatic aberration of the projection optical system.

7. The exposure apparatus according to claim 1, wherein the pattern is a line-and-space pattern, and the position deviation is a position deviation that occurs in an arrangement direction of the pattern.

8. The exposure apparatus according to claim 1, wherein the incident angle is controlled by changing a position of an optical element included in the illumination optical system.

9. The exposure apparatus according to claim 1, wherein an aperture diaphragm is included in the projection optical system, and an incident angle of light with which the substrate is irradiated is changed by changing at least one of a position of the aperture diaphragm and a size of an aperture diameter.

10. The exposure apparatus according to claim 1, wherein each of the first illumination light and the second illumination light is light shifted in wavelength from light with a reference wavelength, which is oscillated from a light source.

11. The exposure apparatus according to claim 10, wherein the wavelength of the first illumination light and the wavelength of the second illumination light are determined according to a shape of the pattern.

12. An exposure apparatus that exposes a substrate to light by using an original in which a pattern is formed and that is capable of switching between a first mode to perform exposure by using illumination light with a reference wavelength and a second mode to perform exposure by using illumination light including first illumination light with a first wavelength different from the reference wavelength and second illumination light with a second wavelength different from the reference wavelength or the first wavelength, wherein the apparatus is configured such that an incident angle of the illumination light having the reference wavelength that enters the original in the first mode and an incident angle of the second illumination light that enters the original in the second mode are made different.

13. The exposure apparatus according to claim 12, wherein the incident angle of the illumination light having the reference wavelength that enters the original in the first mode and the incident angle of the second illumination light that enters the original in the second mode are made different by changing the incident angle of the second illumination light in the second mode.

14. An exposure method of exposing a substrate to light by using an original in which a pattern is formed, comprising the steps of:

illuminating the original with illumination light including first illumination light with a first wavelength and second illumination light with a second wavelength different from the first wavelength;

forming a pattern image of the original using a projection optical system by using the illumination light at a plurality of positions in an optical axis direction of the projection optical system;

adjusting an incident angle of illumination light entering the original to reduce a position deviation in a direction perpendicular to the optical axis direction between a pattern image formed by the first illumination light and a pattern image formed by the second illumination light.

15. A manufacturing method for a semiconductor device, the manufacturing method comprising: a first formation step of forming a groove in a substrate, using the exposure method according to claim 14; and a second formation step of forming a pixel separation portion in the groove.

16. A computer program which, when run on a computer, causes the computer to control an exposure apparatus to carry out the exposure method of claim 14.

* * * * *